(12) United States Patent
Li (10) Patent No.: US 7,629,805 B2
(45) Date of Patent: Dec. 8, 2009

(54) METHOD AND SYSTEM TO DYNAMICALLY COMPENSATE FOR PROBE TIP MISALIGNEMENT WHEN TESTING INTEGRATED CIRCUITS

(75) Inventor: Lixia Li, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 98 days.

(21) Appl. No.: 12/051,300

(22) Filed: Mar. 19, 2008

(65) Prior Publication Data

US 2009/0239316 A1    Sep. 24, 2009

(51) Int. Cl.
  *G01R 31/02* (2006.01)
  *G01K 5/00* (2006.01)
  *H01K 3/10* (2006.01)
(52) U.S. Cl. .................. 324/758; 29/846; 324/760; 702/85
(58) Field of Classification Search ......... 324/754–765, 324/158.1; 702/85, 94, 99, 105; 29/825, 29/846
  See application file for complete search history.

(56) References Cited

U.S. PATENT DOCUMENTS

| | | | | |
|---|---|---|---|---|
| 3,963,985 A | * | 6/1976 | Geldermans | 324/754 |
| 4,063,172 A | * | 12/1977 | Faure et al. | 324/756 |
| 5,689,447 A | * | 11/1997 | Ward | 702/99 |
| 7,002,363 B2 | * | 2/2006 | Mathieu | 324/758 |
| 7,312,618 B2 | * | 12/2007 | Eldridge et al. | 324/754 |

* cited by examiner

*Primary Examiner*—Ernest F Karlsen
(74) *Attorney, Agent, or Firm*—Wade J. Brady, III; Frederick J. Telecky, Jr.

(57) ABSTRACT

Method for dynamically compensating probe tip misalignment with a semiconductor wafer. The wafer is located on a handler and the wafer is adjusted to a first temperature. Probe tips of an inspection system are moved to a first position centered above pads of a test module on the wafer. The first position is recorded in a memory of the inspection system at the first temperature. The wafer and the probe tips are adjusted to a second temperature while the wafer remains in the inspection system. A second position of the probe tips is recorded in the memory while the probe tips and the wafer are equilibrated at the second temperature. A difference between the first and second position is calculated. Relative positions of the probe tips or the wafer is compensated based on the calculated difference, such that the probe tips are re-centered above the pads at the second temperature.

20 Claims, 8 Drawing Sheets

METHOD AND SYSTEM TO DYNAMICALLY COMPENSATE FOR PROBE TIP MISALIGNEMENT WHEN TESTING INTEGRATED CIRCUITS

TECHNICAL FIELD OF THE INVENTION

The present invention is directed, in general, to a method and system for detecting defective integrated circuits, and to manufacturing integrated circuits using such methods and systems.

BACKGROUND OF THE INVENTION

Inspecting integrated circuits (ICs) for defects is an essential part of the IC manufacturing process. Inspection typically includes electrically testing individual IC dies on a wafer to determine if a selected IC die is functional or not. A probe card having multiple probes is coupled to a manipulator, and the wafers to be tested are loaded onto a wafer handler. To test for proper electrical connectivity, the IC tester might send electrical test signals via the probe card to the selected IC die, and the probe card sends a response signal from the IC back to the IC tester. The IC tester evaluates whether or not the test response signal is within an acceptable range. If the test response signal is acceptable, then additional dies on the wafer may be tested, until the wafer has passed the inspection, and then the manufacturing process in continued. If the test response signal is not acceptable, then the wafer is failed.

Before such testing can occur, however, the probe card and wafer are manually aligned with each other such that the probe's tips can touch down onto the bond pads of the selected IC die. Typically, the IC tester records the lateral position of the probe tips relative to the wafer, so that subsequent identical wafers to be tested can be identically positioned.

Traditional methods and instruments to perform such electrical testing are done at room temperature or at a single elevated temperature. When wafers are to be tested at an elevated temperature, to avoid misalignment between the probe tips and the pads, it is sometimes necessary to repeat the manual alignment process and re-record the position of the probe card. Repeating the manual alignment is time consuming because the testing equipment is designed to require the operator to remove the wafer from the wafer handler, adjust the temperature of the handler, and then return the wafer to the handler, before doing the manual alignment process.

SUMMARY OF THE INVENTION

One aspect of the disclosure is a method for dynamically compensating for probe tip misalignment with a semiconductor wafer. The method comprises locating a semiconductor wafer on a wafer handler and adjusting the semiconductor wafer to a first temperature. The method also comprises moving probe tips of an inspection system to a first position centered above pads of a test module on the semiconductor wafer. The first position is recorded in a memory of the inspection system at the first temperature. The method also includes adjusting the semiconductor wafer and the probe tips to a second temperature while the semiconductor wafer remains in the inspection system. A second position of the probe tips is recorded in the memory while the probe tips and the wafer are equilibrated at the second temperature. A difference between the first position and second position is calculated, and, relative positions of the probe tips or the wafer is compensated based on the calculated difference. The compensation is such that the probe tips are re-centered above the pads at the second temperature.

Another aspect of the present invention is an inspection system for testing integrated circuits. The system comprises a wafer handler, an inspection tool and a control module. The wafer handler is configured to move a semiconductor wafer to different positions. The inspection tool includes a test head configured to hold a probe card having multiple probe tips, and a test head manipulator configured to adjust the test head to different positions above the wafer. The inspection tool also includes an IC tester configured to send electrical test signals to the probe tips and to record response signals from the probe tips.

The control module is configured to cause several actions. It causes the test head manipulator to move the probe tips to a first position centered above pads of a test module of the wafer and cause the wafer manipulator to adjust the wafer and probe tips to a first temperature. It causes the inspection tool to record the first position at the first temperature in a memory of the inspection tool. It causes the inspection tool to perform a first test on the test module. It causes the wafer handler to adjust the semiconductor wafer and the probe tips to a second temperature, and then causes the inspection tool to record a second position of the probe tips in the memory while the probe tips and the wafer are equilibrated at the second temperature. The control module also calculates a difference between the first position and the second position. The control module also causes the wafer handler or test head manipulator to compensate relative positions of the probe tips or the wafer based on the difference such that the probe tips are re-centered above the pads at the second temperature. The control module further causes the inspection tool to perform a second test on the test module at the second temperature after the re-centering of the probe tips.

Still another aspect of the present invention is a method of manufacturing an integrated circuit. The method comprises forming integrated circuits, and one or more test modules, on a semiconductor wafer, and inspecting the one or more test modules in accordance with the above-described method.

BRIEF DESCRIPTION OF THE DRAWINGS

The disclosure is described with reference to example embodiments and to the accompanying drawings, in which corresponding or like numbers or characters indicate corresponding or like structures.

DETAILED DESCRIPTION

Unlike testing for electrical connectivity, which is done at room temperature or one elevated temperature, reliability testing entails performing multiple tests on a single wafer at multiple temperatures. Reliability testing refers to a determination of the likelihood that an IC will remain functional for the projected lifetime of the IC. For instance, reliability tests on an IC can include testing leads and vias of the IC for electro migration-induced void or hillock formation, and, measuring the activation energy of diode current leakage. These are usually performed at multiple elevated temperatures. Performing such reliability tests using today's probe testing systems requires repeating the manual alignment process for each of the multiple elevated temperatures required for the test. Consequently, reliability testing can be extremely time-consuming. For instance, using today's probe testing systems and methods, a reliability test of one wafer can take several days to complete.

The present disclosure overcomes this limitation by providing a method and system to adjust probe tip positions in real time. The capability of adjusting probe tip positions in real time is especially important when performing reliability testing of an IC. The method and system of the present disclosure allows the wafer to be retained in the wafer handler while the lateral positions of the probe tips are automatically corrected for misalignment at the each of the different multiple temperatures of the reliability test.

Although the method and system of the present disclosure are particularly beneficial when performing reliability testing, it can also be useful in other cases where the manual alignment process would otherwise have to be repeated. For instance, as a probe card begins to wear out, the lateral position information recorded by the IC tester may no longer be accurate, and there can be misalignment between the probe tips and the pads. The capability of adjusting probe tip lateral positions in real time can eliminate the need to repeat the manual alignment process to compensate for the misalignment of aging probes.

Figure 1:
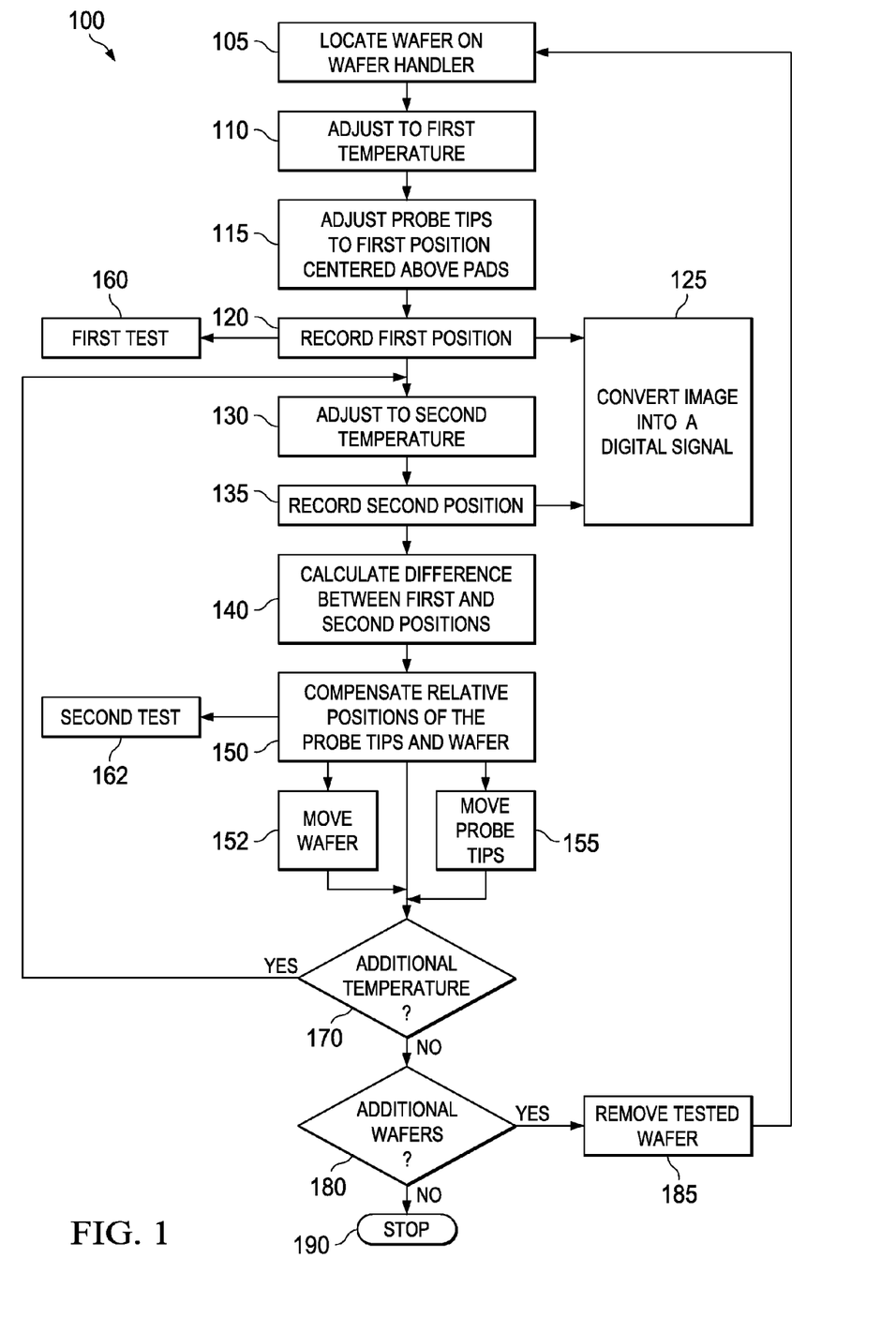
FIG. 1 illustrates by flow diagram, selected steps in an example method for dynamically compensating for probe tip misalignment with a semiconductor wafer according to the principles of the present disclosure.

One aspect of the present disclosure is a method for dynamically compensating for probe tip misalignment with a semiconductor wafer. FIG. 1 illustrates, by flow diagram, selected steps in an example method 100 dynamically compensating for probe tip misalignment with a semiconductor wafer according to the principles of the present disclosure. The method comprises, in step 105, locating a semiconductor wafer on a wafer handler, and, in step 110, adjusting the semiconductor wafer to a first temperature (e.g., room temperature). E.g., in some cases, the wafer handler has a heating element, and the temperature of the wafer is adjusted via conductive heating through the wafer handler.

The semiconductor wafer, such as a silicon wafer, comprises a plurality of IC dies. Each of the IC dies has pads (e.g., bond pads) formed on the surface of the IC and to be used to connect the active and passive structures of the IC (e.g., transistors, capacitors, resistors etc . . . ) to components of an electronic device. In some cases, one or more of the IC dies are designated as test modules upon which the method 100 is applied. In other cases, the tests module has pads, but the pads are not connected to underlying active or passive device structures.

In step 115, the probe tips of an inspection system are adjusted to a first position centered above pads of a test module on the semiconductor wafer. The term, centered above, as used herein refers to each probe tip being directly above individual pads of the test module such that, if the probe tips are touched down on the wafer, the probe tips will make electrical contact with the appropriate pad.

In some embodiments, the probe tips are adjusted to be slightly above the wafer's surface before adjusting the wafer to the first temperature in step 110. For instance, when the wafer is heated via the wafer handler, it can be desirable to locate the probe tips close the wafer (e.g., within about 100 micron of the wafer's surface) so that the probe tips are also heated, and the probe tips and wafer are equilibrated to the same temperature.

In step 120, the first position is recorded in a memory of the inspection system at the first temperature. E.g., recording of the first position in step 120 occurs while the wafer and probe tips are both substantially equilibrated to (e.g., within about ±2° C.) the first temperature. In some cases, the recording step 120 is performed when the probe tips is touched down onto the pads. Touching the probe's tips down on the pads can provide a convenient means of triggering the recording step 120. In other cases, however, the probe tips is held a small distances (e.g., about 100 microns or less) above the pads when the recording step 120 is performed. Not touching the probe tips to the pads when recording has the advantage of not damaging or wearing-out one or both of the pads or the probe tips.

In some embodiments, recording in step 120 includes converting (step 125) an image of the probe tip above the pads into a digital signal. The digital signal can include a character code (e.g., American Standard Code for Information Interchange, ASCII) that includes the positions of the probe tips.

In step 130, the semiconductor wafer and the probe tips are adjusted to a second temperature (e.g., greater than room temperature) while the semiconductor wafer remains in the inspection system. Keeping the wafer in the inspection system while adjusting the temperature allows relative changes in the position of the probe tip to be determined in an automated fashion by the inspection system.

In step 135, a second position of the probe tips is recorded in the memory of the inspection system while the probe tips and the wafer are equilibrated at the second temperature. The second recording step 135 can be performed in the same fashion as, and can comprise any of the embodiments of, the first recording step 120. E.g., recording step 135 can include converting an image of the probe tips and wafer to a digital signal in accordance with step 125. It is also important to allow the probe tips and wafer to both substantially equilibrated at the second temperature before performing the second recording step 135. E.g., recording can be done when both wafer and probe tips are both within about ±2° C. of the second temperature. One skilled in the art would understand how to determine the length of time need to equilibrate the probe tips and wafer to the second temperature, program the inspection system to wait for this time before recording.

Due to differences in the thermal expansivity of the wafer versus the probe tips and probe card, and depending the magnitude of the change in temperature, the probe tips may no longer be centered above the pads of the test module. Such a misalignment could give a false failure of the test module if a test were performed while the probe tips are at the second position and temperature. As an example, sometimes the first and second temperatures are sufficiently different that substantial misalignment can occur between the probe tips and the pads. E.g., in some cases, an about 50° C. or greater difference between the first and second temperatures can cause the probe tip's position to be such that it no longer contacts an about 50 micron$^2$ pad. It is therefore important, and in some cases critical, for the probe tips and the wafer to both be equilibrated at the first and second temperature when recording the first (steps 120) and second position (step 135), respectively, so that any temperature-induced misalignment can be calculate accurately.

In other cases, however, the first temperature and second temperature are substantially equal to each other. E.g., after the probe tips have been used to probe many in a batch of wafers (e.g., 100s or 1000s of wafers), the probe tip can begin to wear-out. Consequently the probe tip can become misaligned as compared to the probe tips position on the first wafer of the batch of wafers tested. The method 100 can be applied to compensate for such misalignments, analogous to the misalignment caused by temperature differences.

In step 140, a difference between the first position and second position is calculated. In some embodiments, calculating the difference in step 140 includes obtaining Cartesian coordinate locations from the digital signals that correspond to the first and second positions, as obtained in the first and second recordings 120, 135, respectively. E.g., obtaining the Cartesian coordinate locations can include applying a computer program to read the ASCII code recorded in recording steps 120 and 135. The calculated difference can therefore include differences between Cartesian coordinates of the probe tips at the first position and at the second position. E.g., the calculated difference can be the differences of ordinate and abscissa coordinates (e.g., $\Delta x$, $\Delta y$ coordinates) of each of the probe tips at the first versus the second positions. In other embodiments, however, the difference between the first position and second position can be represented by other coordinate systems. E.g., the difference can includes vector coordinates between the probe tips in the first location and the second location. E.g., the change in position of each probe tip from the first to second temperature can be represented by a vector.

In step 150, relative positions of the probe tips and wafer are compensated for, based on the difference calculated in step 140, such that the probe tips are re-centered above the pads at the second temperature (e.g., centered above the same pads as for the first temperature). In some embodiments of the method 100, compensating the relative positions of the probe tips or wafer (step 150) can include moving, in step 152, the wafer handler by the difference calculated in step 140. E.g., the wafer is moved the same direction and distance that the probe tips moved by in changing from the first to second positions. In other embodiments, compensating (step 150) can include moving, in step 155, the probe tips by an inverse of the difference calculated in step 140. E.g., the inspection system moves the probe tips back from the second position to the first position. In still other embodiments, a combination of moving the wafer (step 152) and moving the probe tips (step 155) can be performed so as to be re-centered above the pads at said second temperature.

As illustrated in FIG. 1, some embodiments the method 100 further include performing tests at the first temperature (step 160) and at the second temperature (step 162). E.g., reliability tests performed in step 160 or step 162 can include testing leads and vias of the test module for electro migration-induced void or hillock formation, while the probe tips and wafer remain equilibrated at ether the first or second temperature. E.g., these reliability tests can include measuring the activation energy of diode current leakage, determining rates of current leakage at the first and second temperatures. Conventional electrical connectivity tests could also be performed as part of step 160, at one or both of the first and second temperature.

As depicted by decision step 170, in FIG. 1, the method 100 can also include repeating steps 130 to 150 for the same wafer at additional temperatures, if desired. This can be advantageous for performed certain tests in accordance with step 162 (e.g., reliability tests that include measuring the activation energy of diode current leakage). E.g., the semiconductor wafer and probe tips can be adjusted to additional temperatures (step 130), and the recording (step 135), the calculating (step 140) and the compensating (step 150) steps can be repeated for each of the additional temperatures. The test (step 162) can then be performed at each of the additional temperatures.

As depicted by decision step 180 in FIG. 1, the method 100 can be performed on additional semiconductor wafers in accordance with steps 105 to 170, if desired. E.g., after performing reliability tests or other tests of a semiconductor wafer at multiple temperatures, the wafer handler can remove the tested wafer from the inspection system (step 185) and the above-described step repeated for another wafer. If there are no additional temperatures to adjust to, and, additional wafers to examine, the method is ended (stop step 190).

Figure 2:
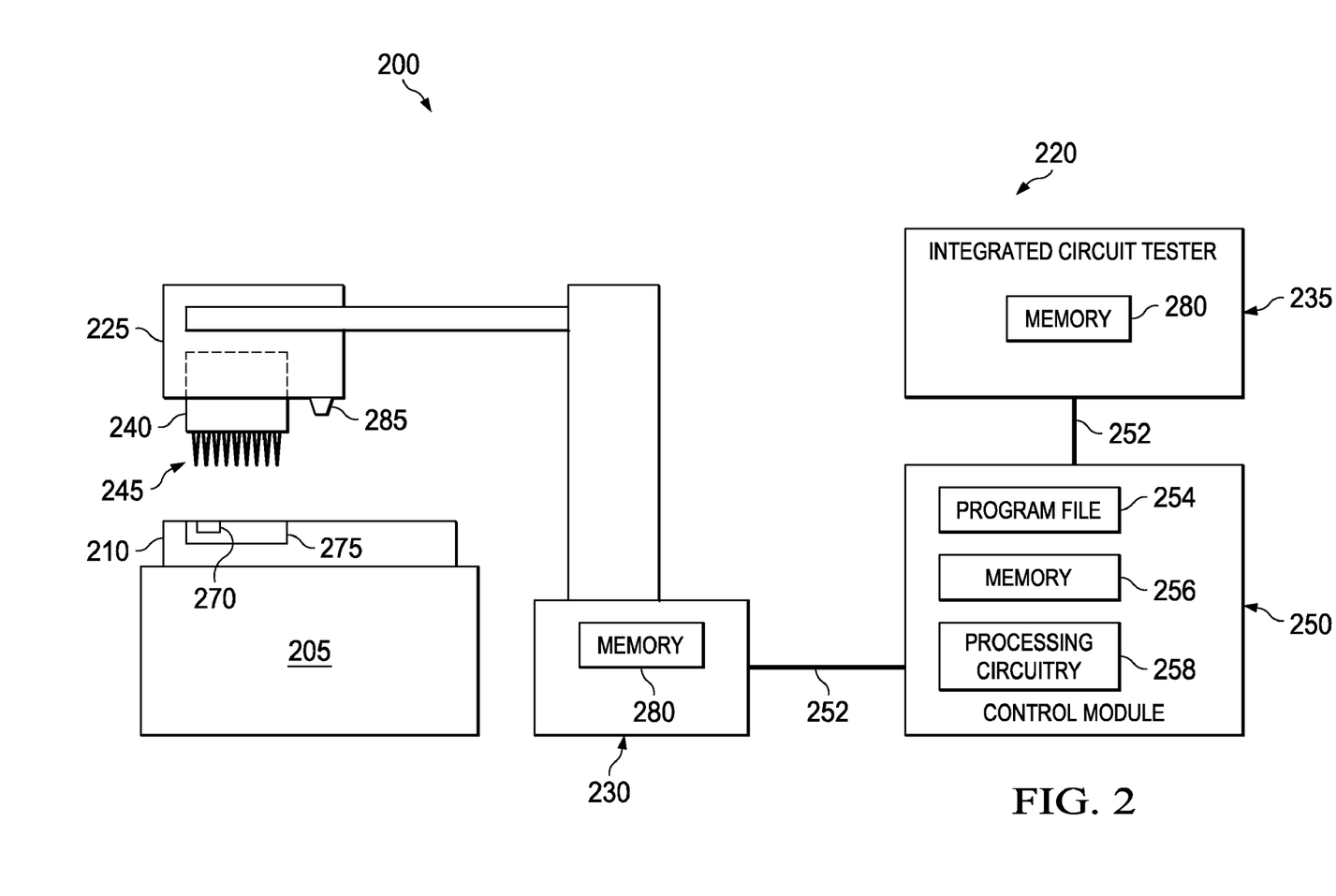
FIG. 2 presents a block diagram of an example inspection system of the present disclosure for testing integrated circuits.

Another aspect of the present disclosure is an inspection system for testing ICs. FIG. 2 presents a block diagram of an example inspection system 200 of the present disclosure.

The inspection system 200 comprises a wafer handler 205 configured to move a semiconductor wafer 210 to different positions. The system 200 also comprises an inspection tool 220. The inspection tool 220 includes a test head 225, a test head manipulator 230, and an IC tester 235. The test head 225 is configured to hold a probe card 240 having multiple probe tips 245. The test head manipulator 230 is configured to adjust the test head 225 to different positions above the wafer 210. The IC tester 235 is configured to send electrical test signals to the probe tips 245, and to record response signals from the probe tips 245.

The system further comprises a control module 250. The control module 250 can comprise any conventional processing device capable of performing operations needed to control the inspection of microelectronic devices, and include components well known to those skilled in the art. Such components can include a bus 252 to send commands to, and receive data from, the wafer handler 205 or inspection tool 220, a program file 254 to control the wafer handler 205 or inspection tool 220, a memory 256 to hold data obtained by the wafer handler 205 or inspection tool 220, and processing circuitry 258 to perform mathematical operations on the data.

In some cases, the control module 250 is part of the inspection tool 220. E.g., the control module 250 can be incorporated into and use components (bus, memory, processing circuitry etc . . . ) of the test head manipulator 230 or IC tester 235. In other cases, as shown in FIG. 2, the control module 250 is separate from the inspection tool 220.

The control module 250 is configured to direct and coordinate the system's 200 components to perform the dynamic compensation for probe tip misalignment, as described in the present disclosure. E.g., any of the method steps and their embodiments presented in the context of FIG. 1 can be performed by the system 200, as facilitated by the control module 250.

With continuing reference to FIGS. 1 and 2, the control module 250 is configured to cause the test head manipulator 230 to move the probe tips 245 to a first position centered above pads 270 of a test module 275 of the wafer 210 (step 115), and to cause the wafer manipulator 205 to adjust the wafer 210 and the probe tips 245 to a first temperature (step 110). E.g., the program file 254 of the control module can configure the inspection tool 220 to move the test head manipulator 230 and configure the wafer manipulator 205 to apply heat to the wafer 210, with indirect heating to the probe tips 245.

The control module 250 is also configured to cause the inspection tool 220 (e.g., the test head manipulator 230 or IC tester 235) to record first position at the first temperature in a memory of the inspection tool 220 (step 120), and to cause the inspection tool 220 to perform a first test (step 160) on the test module 275. E.g., the memory 280 can be located in the test head manipulator 230 or in the IC tester 235, and the first test can be a reliability test, or part of a reliability test. In some embodiments, the control module 250 (e.g., the program file 254) can configure one or more cameras 285 located in the test head 225 to obtain one or more images of the probe tips 245 above the pads 270, when the wafer 210 and probe tips 245 are equilibrated to the first temperature.

In similar fashion, the control module 250 is configured to cause the wafer handler 205 to adjust the semiconductor wafer 210 and the probe tips 245 to a second temperature (step 130), and then cause the inspection tool 220 to record a second position of said probe tips in tool's memory 280 (step 135) after the wafer 210 and probe tips 245 have equilibrated to the second temperature.

The control module 250 is further configured to calculate a difference between the first position and the second position (step 140). E.g., the program file 254 can configure the processing circuitry 258 to convert the images obtained by the cameras 285 into digital signals, and then to extract Cartesian coordinate locations from the digital signals corresponding to the first and second positions. E.g., program file 254 can configure the processing circuitry 258 to extract position information from an ASCII code representation of the images. The program file 254 can further configure the processing circuitry 258 to calculate a difference between the first and second positions and store the difference in the control module's memory 256.

The control module 250 is still further configured to cause the wafer handler 205 or the test head manipulator 230 to compensate relative positions of the probe tips 245 or the wafer 210 based on the difference (step 150). The compensation is such that the probe tips 245 are re-centered above the pads 270 at the second temperature. E.g., is some cases, the program file 254 configures the wafer handler 205 to move the wafer 210 by the difference (step 152). In other cases, the program file 254 configures the test head manipulator 230 to move the test head 225 (and therefore the move the probe card 240 and probe tips 245) by an inverse of the difference (step 155).

The control module 250 is also configured cause the inspection tool 220 to perform a second test (e.g., an additional or continuation of the reliability test) on the test module 275 at the second temperature after the probe tips 245 are re-centered (step 162).

The control module 250 can also be configured to automatically perform the decision steps 170, 180 to inspect additional temperatures of the same wafer, or inspect a different wafer, respectively, and configure the wafer handler 205 to, as appropriate, remove the wafer (step 185) or to stop the inspection (step 190).

Still another aspect of the present disclosure is a method of manufacturing an IC. Any aspect of the method and system discussed in the context of FIGS. 1 and 2 can be incorporated into the manufacture of the IC. FIGS. 3-8 present semi-transparent perspective views of selected steps in an exemplary method of manufacturing an example integrated circuit 300 according to the principles of the present disclosure.

Figure 3:
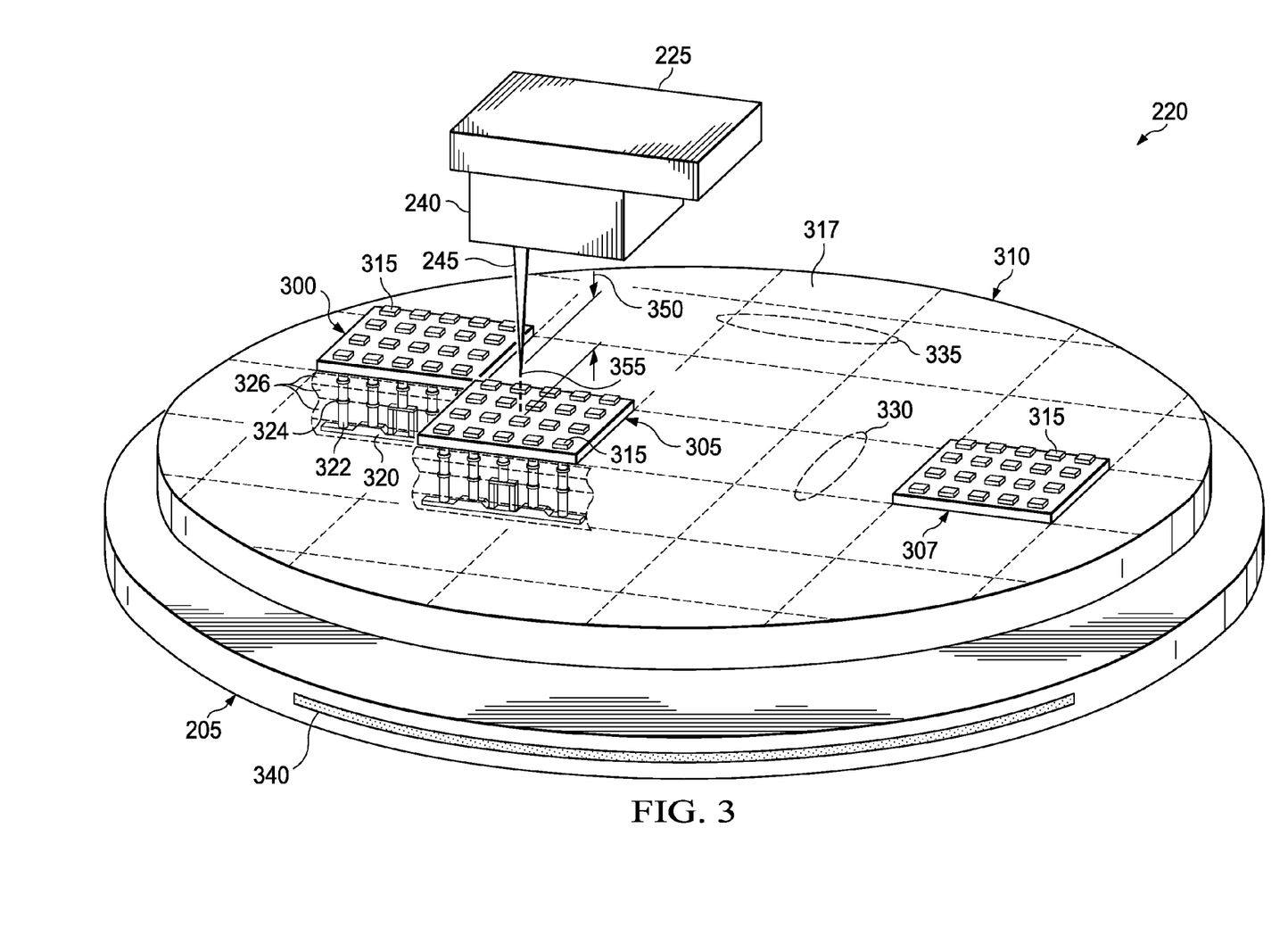
FIGS. 3-8 illustrate cross-sectional views of selected steps in an example method of manufacturing an integrated circuit according to the principles of the present disclosure.

FIG. 3 illustrates the manufacturing method which comprises forming ICs 300 and one or more one test modules 305, 307 on a semiconductor wafer 310. For clarity, the size and features of the IC 300 and the test module 305 relative to the wafer 310 are not shown to scale.

One of ordinary skill in the art would be familiar with conventional front-end-of-line methods and materials to fabricate the ICs 300 and their component parts. For instance, in addition to bond pads 315 at the wafer's surface 317, embodiments of the IC 300 can include conventional active and passive devices 320 such as transistors (e.g., nMOS and pMOS transistors), diodes, capacitors, resistors etc. . . . , as well as leads 322 and vias 324 formed in inter- and intra-metal dielectric layers 326 on the wafer 310.

In some embodiments, the test module 305, includes, or is, one of the integrated circuits 300. In some cases, it is advantageous for the test module 305 to be substantially the same as the ICs 300, because then tests done on the test module can provide direct information about the ICs 300. E.g., reliability tests to evaluate electro migration-induced problems with the leads 322 and vias 324 of an IC 300 can be examined by testing the test module 305 if the module 305 includes the same leads 322 and vias 324 as in the IC 300.

In other cases, however, the test module (e.g., test module 307) can have pads 315, but not the underlying devices 320. E.g., the pads 315 of the test module 307 are not connected to active or passive devices. In such cases, the test module 307 can be used to compensate for probe tip misalignment with the wafer 310, and a different test module 305 that do have the underlying devices 320 and connective structures 322, 324, or, another IC 300, is using for testing.

If the test module 305 or integrated circuit 300 passes the tests, then the manufacture of the integrated circuit 300 is completed by performing conventional back-end-of-line processes such as wafer 310 singulating and packaging. If the test module 305 or integrated circuit 300 fails the tests, then the semiconductor wafer 310 is rejected.

Because the pads 315 of the test module 305 can be contacted by a probe tip, either during the method to compensate for probe tip misalignment, and/or during testing, there is a risk that the test module 305 can become damaged. In other cases the test module 307 is non-functional by design. To ensure that such test modules 305, 307 are not incorporated into an end-use electrical device, in some embodiments, the test module 305, 307 is located in one or more scribe lines 330, 335 of the semiconductor wafer 310. In such embodiments, the test modules 305, 307 are destroyed when the wafer 310 is singulated to separate the ICs 300 from each other.

FIG. 3 also illustrates some parts of another step in the method of IC manufacturing: inspecting the one or more test modules 305, 307. As discussed-above in the context of FIG. 2, inspecting the wafer 310 is performed using an inspection tool 220. For clarity, certain components of the inspection tool 220 are not illustrated in FIGS. 3-8, with the exception of the test head 225, probe card 240 and probe tip 245. Also for clarity, only one probe tip 245 of the probe card 240 is depicted. The wafer handler 205, inspection tool 220, probe card 240 etc . . . can be part of an inspection system such as described above in the context of FIG. 2.

FIG. 3 shows the wafer 310 after being located on the wafer handler 205, and after adjusting the wafer 310 to a first temperature. Locating the wafer 310 on the wafer handler 205 can include the conventional registering of alignment marks and pad locations, step index values, etc . . . into the inspection tool 220. Adjusting the wafer's 310 temperature can include heating the wafer 310 via a heating element 340 of the wafer handler 205. In some embodiments, the probe tips 245 are located a small distance 350 (e.g., about 100 microns or less) above the pads 315 to facilitate equilibration of the probe tips 245 to the first temperature. FIG. 3 also depicts the wafer 310 and inspection tool 220 after moving the probe tips 245 of the inspection tool 220 to a first position 355 above the pads 315 of the test module 305.

Figure 4:
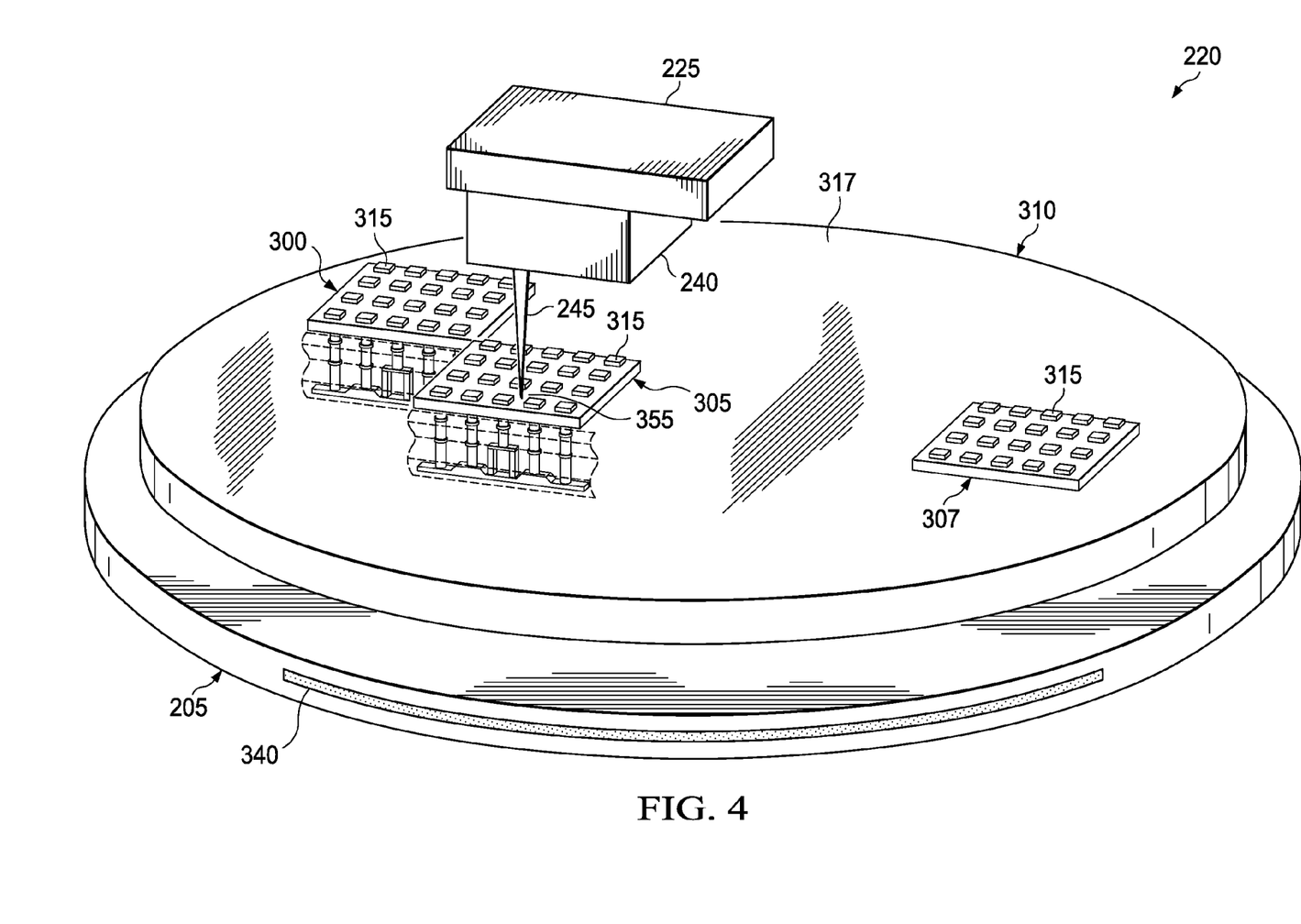

FIG. 4 shows the wafer 310 and inspection tool 220 after recording the first position 355 in a memory of the inspection tool 220 while the wafer 310 and probe tips 245 are equilibrated at the first temperature. In the particular embodiment depicted in FIG. 4 the recording of the first position 355 is triggered by touching the probe tips down on the pads 315 of the test module 305. In some cases, first tests (e.g., reliability tests) are performed on the test module 305 at the first temperature. After recording the position 355 or performing the first tests, the inspection tool 220 can move the probe tips 245 to be raised slightly above the pads 315, similar to that depicted in FIG. 3.

Figure 5:
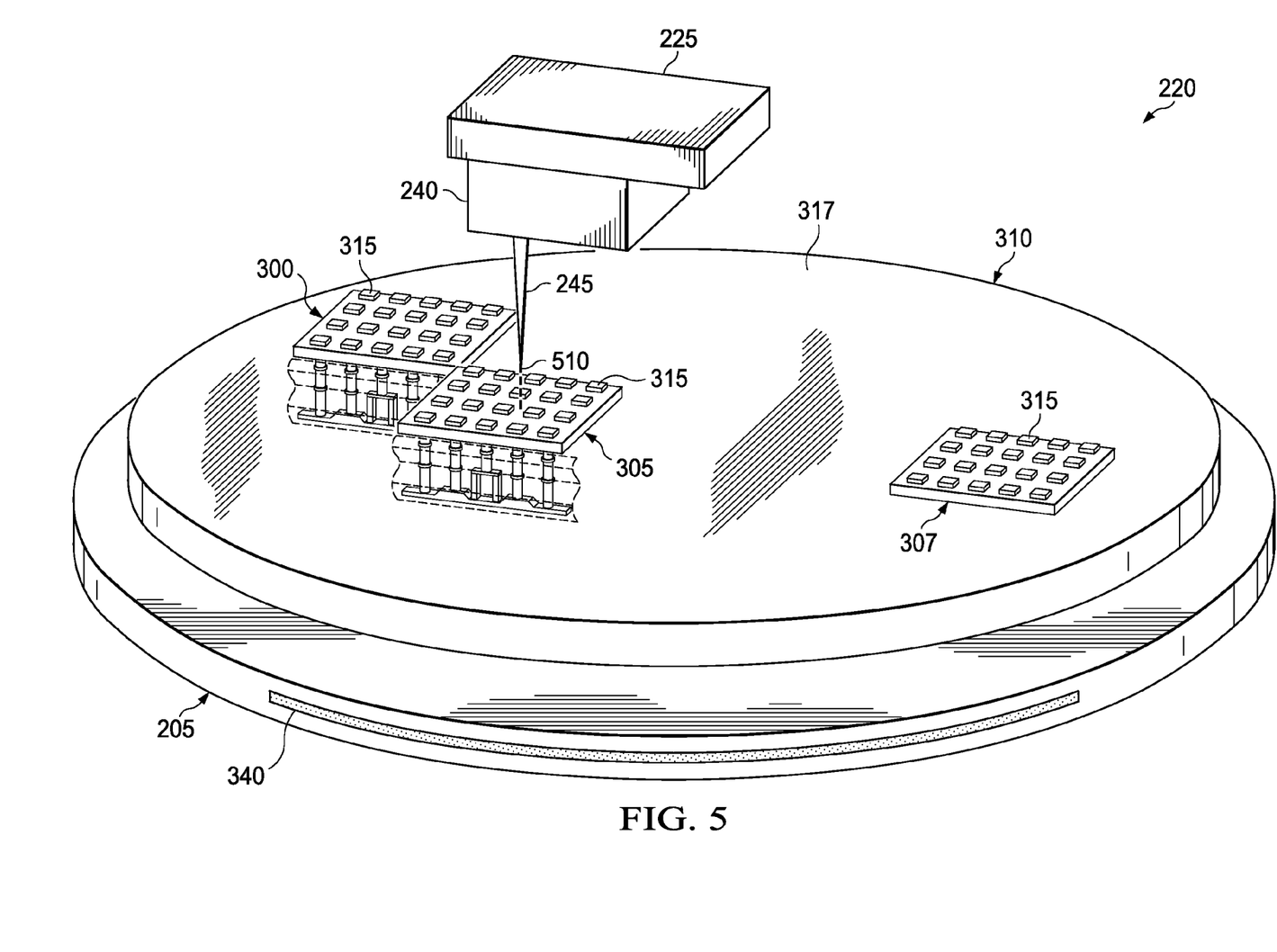

FIG. 5 shows the wafer 310 and inspection tool 220 after adjusting the wafer 310 and probe tips to a second temperature. In this example the first and second temperatures are sufficiently different to cause a substantial misalignment between the probe tips 245 and their respective pads 315. Consequently, when the wafer 310 and probe tips 245 have equilibrated to the second temperature a second position 510 of the probe tip is not centered above the same pad 315 as it was at the first temperature (e.g., position 355 in FIGS. 3 and 4).

Figure 6:
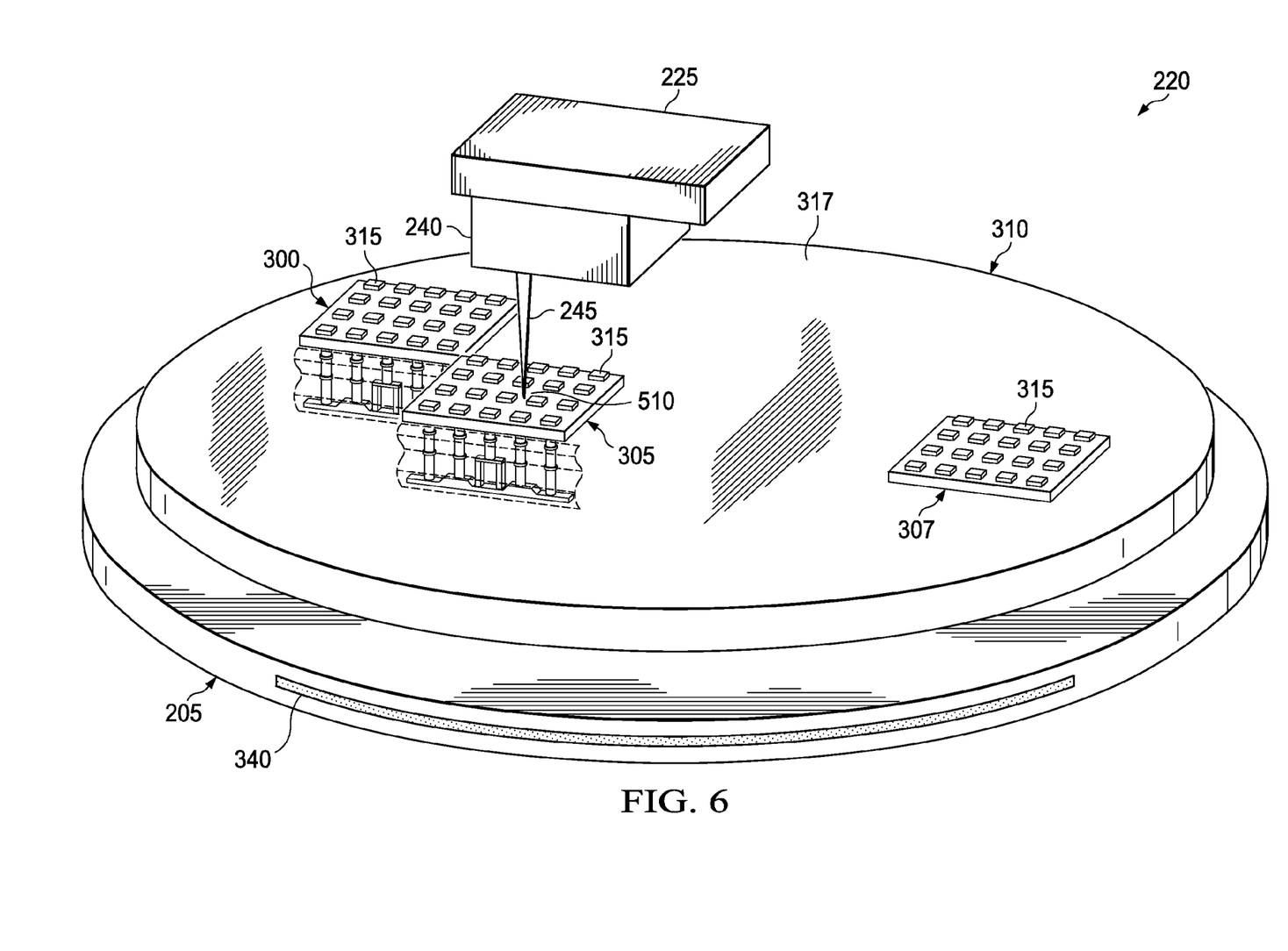

FIG. 6 shows the wafer 310 and inspection tool 220 after recording the second position 510 in the memory of the inspection tool 220 while the wafer 310 and probe tips 245 are equilibrated at the second temperature. Again, similar to that discussed in the context of FIG. 4, the recording event can be triggered by touching down on the wafer's surface 317, which in this example, is not on a pad 315. Also similar to that discussed above, in some cases, tests (e.g., the same or different reliability tests) are performed on the test module 305 at the second temperature. Once again, after recording the second position 510 and performing the tests, the inspection tool 220 can move the probe tips 245 to be slightly above the pads 315 (similar to that depicted in FIG. 5).

Figure 7:
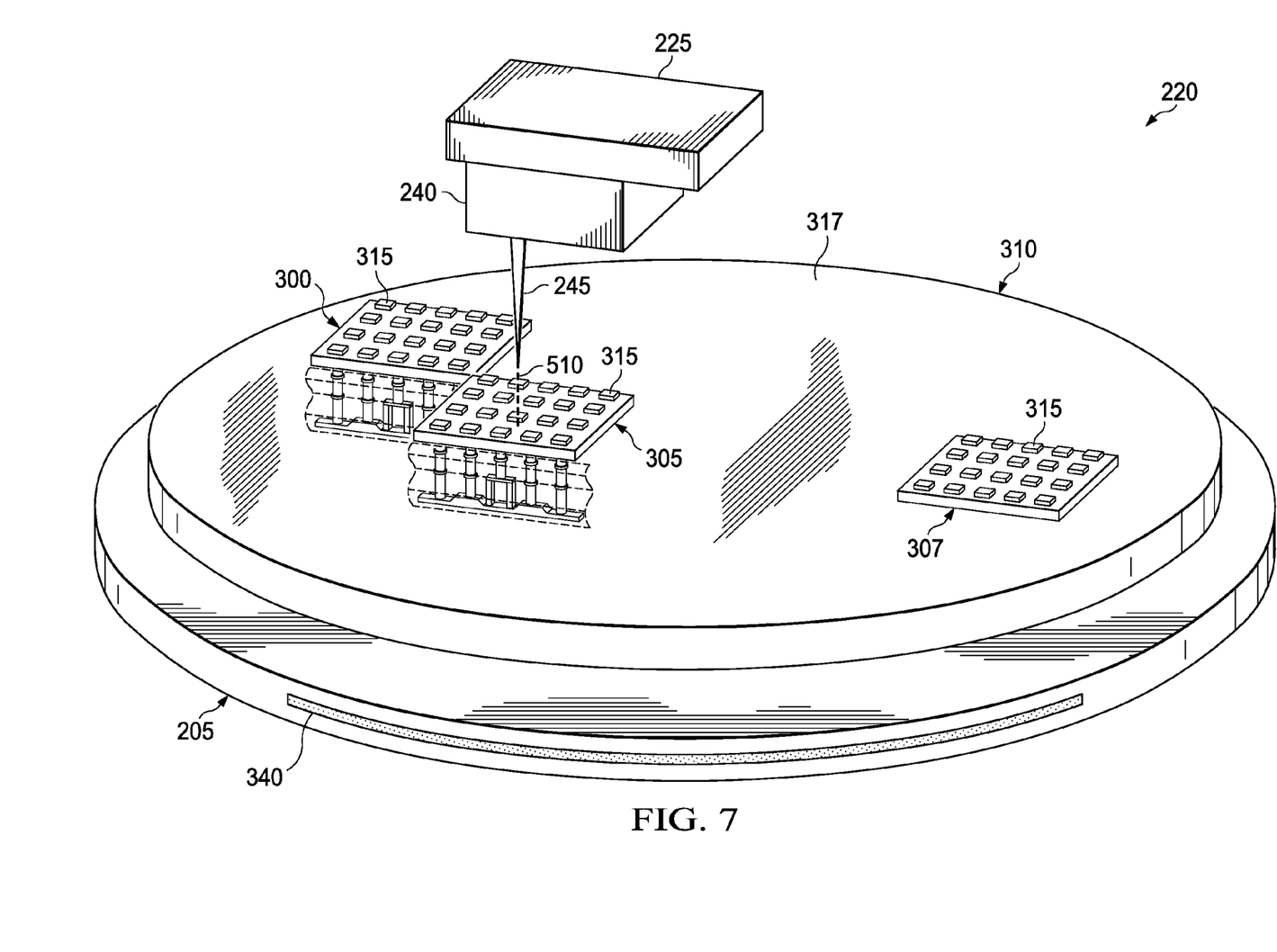

FIG. 7 shows the wafer 310 and the inspection tool 220 after calculating a difference between the first position 355 (FIG. 4) and the second position 510. FIG. 7 also shows the wafer 310 and inspection tool 220 after compensating relative positions of the probe tips 245 or the wafer 310 based on the difference such that the probe tips 245 are re-centered above the pads 315 at the second temperature. Any of the methods described in the context of FIGS. 1 and 2 can be used to calculate the difference and perform the compensation. E.g., the control module 250 (FIG. 2) can calculate the difference in accordance with step 140 (FIG. 1) and instruct the wafer handler 205 or inspection tool 220 or to make the compensation in accordance with step 150. E.g., in the example presented in FIG. 7, the wafer handler 205 has moved the wafer 310 by the difference such that the probe tips are re-centered above the pads 315.

Figure 8:
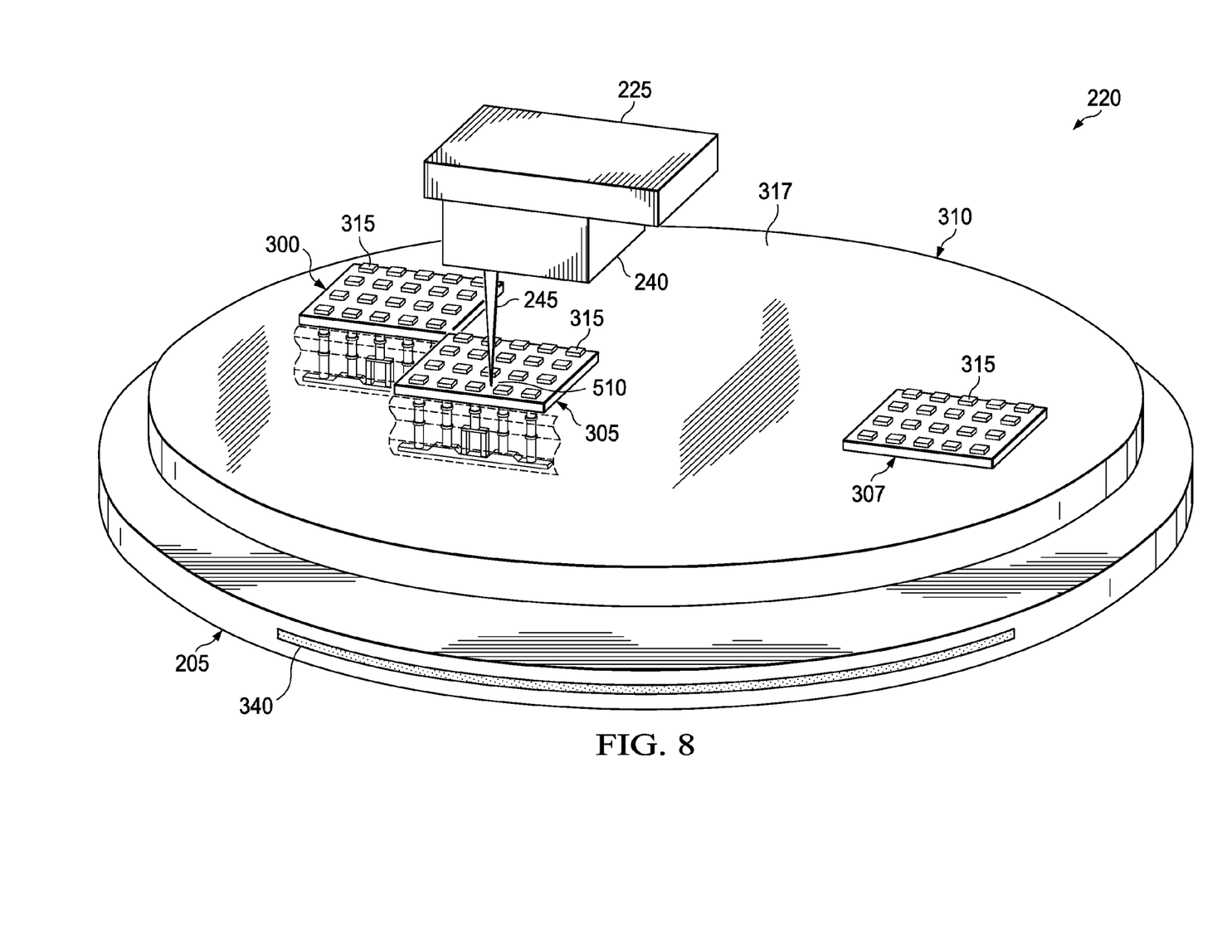

FIG. 8 illustrates the wafer 310 and inspection tool 220 while performing second tests at the second temperature., E.g., after calculating the difference and making the compensation, the probe tips 245 can be touched down on the pad 315 and second tests are performed (e.g., a continuation of the first reliability test, or a new reliability test).

Although the present invention has been described in detail, those skilled in the art should understand that they can make various changes, substitutions and alterations herein without departing from the scope of the invention in its broadest form.

What is claimed is:

1. A method for dynamically compensating for probe tip misalignment with a semiconductor wafer, comprising:
    locating a semiconductor wafer on a wafer handler and adjusting said semiconductor wafer to a first temperature;
    moving probe tips of an inspection system to a first position centered above pads of a test module on said semiconductor wafer, and recording said first position in a memory of said inspection system at said first temperature;
    adjusting said semiconductor wafer and said probe tips to a second temperature while said semiconductor wafer remains in said inspection system, and then recording a second position of said probe tips in said memory while said probe tips and said wafer are equilibrated at said second temperature;
    calculating a difference between said first position and said second position; and
    compensating relative positions of said probe tips or said wafer based on said difference such that said probe tips are re-centered above said pads at said second temperature.

2. The method as recited in claim 1, wherein said compensating includes moving said wafer handler by said difference.

3. The method as recited in claim 1, wherein said compensating includes moving said probe tips by an inverse of said difference.

4. The method as recited in claim 1, wherein said difference includes differences between Cartesian coordinates of said probe tips at said first location and at said second location.

5. The method as recited in claim 1, further including adjusting said semiconductor wafer and said probe tips to additional temperatures, and performing said recording, said calculating and said compensating for each of said additional temperatures.

6. The method as recited in claim 1, further including performing reliability tests at said first temperature and at said second temperature.

7. The method as recited in claim 1, wherein said recording is performed when said probe tips touch down onto said pads.

8. The method as recited in claim 1, wherein said recording includes converting a image of said probe tip above said pads into a digital signal and calculating the difference includes obtaining Cartesian coordinate locations from said digital signal that correspond to said first and second positions.

9. The method as recited in claim 8, wherein said digital signal includes an ASCII code and obtaining said Cartesian coordinate locations includes applying a computer program to read said ASCII code.

10. An inspection system for testing integrated circuits, comprising:
    a wafer handler configured to move a semiconductor wafer to different positions;
    an inspection tool that includes: a test head configured to hold a probe card having multiple probe tips, a test head manipulator configured to adjust said test head to different positions above said wafer, and an IC tester configured to send electrical test signals to said probe tips and to record response signals from said probe tips; and
    a control module configured to:
        cause said test head manipulator to move said probe tips to a first position centered above pads of a test module of said semiconductor wafer and to cause said wafer manipulator to adjust said wafer and said probe tips to a first temperature,
        cause said inspection tool to record said first position at said first temperature in a memory of said inspection tool,
        cause said inspection tool to perform a first test on said test module;
        cause said wafer handler to adjust said semiconductor wafer and said probe tips to a second temperature, and then cause said inspection tool to record a second position of said probe tips in said memory while said probe tips and said wafer are equilibrated at said second temperature;

calculate a difference between said first position and said second position;

cause the wafer handler or test head manipulator to compensate relative positions of said probe tips or said wafer based on said difference such that said probe tips are re-centered above said pads at said second temperature, and cause said inspection tool to perform a second test on said test module at said second temperature after said re-centering of said probe tips.

11. The inspection system as recited in claim 10, wherein compensating said relative positions includes causing said wafer handler to move by said difference.

12. The inspection system as recited in claim 10, wherein compensating said relative positions includes causing said test head manipulator to move said test head by an inverse of said difference.

13. The inspection system as recited in claim 12, wherein said first and second tests are reliability tests.

14. The inspection system as recited in claim 10, wherein said test head include one or more cameras configured to obtain images of said probe tip above said pads, and said control module is configured to convert said images into digital signals and extract Cartesian coordinate locations from said digital signals that correspond to said first and second positions.

15. A method of manufacturing an integrated circuit comprising:

forming integrated circuits, and one or more test modules on, a semiconductor wafer; and inspecting said one or more test modules, including:

locating said semiconductor wafer on a wafer handler and adjusting said wafer to a first temperature;

moving probe tips of an inspection tool to a first position centered above pads of a test module of said semiconductor wafer, and recording said first position in a memory of said inspection tool at said first temperature;

adjusting said semiconductor wafer and said probe tips to a second temperature, and then recording a second position of said probe tips in said memory while said probe tips and said wafer are equilibrated at said second temperature;

calculating a difference between said first position and said second position;

compensating relative positions of said probe tips or said wafer based on said difference such that said probe tips are re-centered above said pads at said second temperature.

16. The method as recited in claim 15, further including performing tests on said test module at said first and said second temperatures.

17. The method as recited in claim 16, wherein said semiconductor wafer is rejected if said test module fails said tests.

18. The method as recited in claim 15, wherein said test module includes one of said integrated circuits.

19. The method as recited in claim 15, wherein said pads of said test module are not connected to active or passive devices.

20. The method as recited in claim 15, wherein said test module is located in one or more scribe lines of said semiconductor wafer.

* * * * *